United States Patent [19]

Vanhanen et al.

[11] Patent Number: 5,276,917
[45] Date of Patent: Jan. 4, 1994

[54] TRANSMITTER SWITCH-ON IN A DUAL-MODE MOBILE PHONE

[75] Inventors: Petteri Vanhanen, Jääli; Markku Myrskog, Oulu; Arto Seppänen, Oulunsalo, all of Finland

[73] Assignee: Nokia Mobile Phones Ltd., Salo, Finland

[21] Appl. No.: 781,998

[22] Filed: Oct. 22, 1991

[51] Int. Cl.[5] .................. H01Q 11/12; H04B 1/04
[52] U.S. Cl. ........................ 455/89; 455/95; 455/119; 455/127; 330/51; 330/310; 379/59
[58] Field of Search .............. 455/13.4, 89, 95, 126, 455/127, 115, 116, 119; 330/51, 149, 310; 379/59

[56] References Cited

U.S. PATENT DOCUMENTS

| | | | |
|---|---|---|---|
| 3,962,553 | 6/1976 | Linder et al. | 455/89 |
| 4,288,753 | 9/1981 | Babano | 330/51 |
| 4,371,841 | 2/1983 | Eckert et al. | 330/51 |
| 5,020,093 | 5/1991 | Pireh | 379/59 |
| 5,029,005 | 7/1991 | Morris, Jr. | 330/51 |
| 5,060,294 | 10/1991 | Schwent et al. | 330/51 |
| 5,109,541 | 4/1992 | Park | 455/89 |
| 5,150,075 | 9/1992 | Hietala et al. | 455/126 |
| 5,159,283 | 10/1992 | Jensen | 455/126 |

FOREIGN PATENT DOCUMENTS 0407135 1/1991 European Pat. Off.
0416613 3/1991 European Pat. Off.

Primary Examiner—Reinhard J. Eisenzopf
Assistant Examiner—Timothy H. Keough
Attorney, Agent, or Firm—Darby & Darby

[57] ABSTRACT

A method for providing a positive transmitter power switch-on in a dual-mode mobile phone is disclosed. According to the invention the transmitter is switched on in two or more phases, controlled by the mobile phone microprocessor program. Preferably the power amplifier sections are switched on in a sequence, so that the output power amplifier sections (3 and 4) are first switched on by enabling the transmit enable signal (TXE). Then the input power amplifier sections (1 and 2) are switched on by enabling ramp-up signal (RAMP-UP) Transmission is thereafter enabled by the transmit power control signal (TXC) being switched on, the amplifiers then output the amplified radio frequency input signal (RFIN) to the duplex circuit (10) transmit terminal (TX).

6 Claims, 1 Drawing Sheet

TRANSMITTER SWITCH-ON IN A DUAL-MODE MOBILE PHONE

BACKGROUND OF THE INVENTION

This invention relates to a method for providing a positive transmitter power switch-on in a dual-mode mobile radiotelephone having a programmable logic in the digital mode controlling the switching-on of two or more transmitting power amplifier sections.

In digital mobile radiotelephones planned to operate according to North American dual-mode standard it is required that the transmitter must be switched off during certain specified intervals when the mobile phone operates in the digital mode. The transmitter is switched on for transmission during transmission intervals. A simple on/off switching of the transmitter produces some negative effects, e.g. a very broad frequency spectrum of the transmitter in the initial transmission phase.

SUMMARY OF THE INVENTION

It is an object of the present invention to provide a method of switching the transmitter that is effectively eliminates the drawbacks of simple transmitter on/off switching in digital mobile radio telephones. It is further an object of this invention to provide a transmitter arrangement operating according to the inventive method.

According to the inventive method the transmitter is switched on in two or more phases that ensure a stable operation of the transmitter. The method of the preferred embodiment consists of the steps of sequentially switching on the power amplifier sections; and thereafter switching on the transmit power control signal. In another embodiment the sequential amplifier switch on consists of two steps: switching on the output power amplifier sections by enabling the transmit enable signal; and thereafter switching on the input power amplifier sections by enabling the ramp-up signal.

Still another embodiment comprises the steps of first switching on the output power amplifier sections by enabling the transmit enable signal; and thereafter switching on the input power amplifier sections by enabling the ramp-up signal, and switching on the transmit power control signal.

The inventive dual-mode mobile radiotelephone operates in accordance with the method as described.

BRIEF DESCRIPTION OF THE DRAWINGS

The invention is further described by way of example with reference to the accompanying drawing, in which the only figure is a block diagram showing the main parts of the digital transmitter in a dual-mode mobile radio telephone.

DESCRIPTION OF ILLUSTRATIVE EMBODIMENTS

Figure 1:
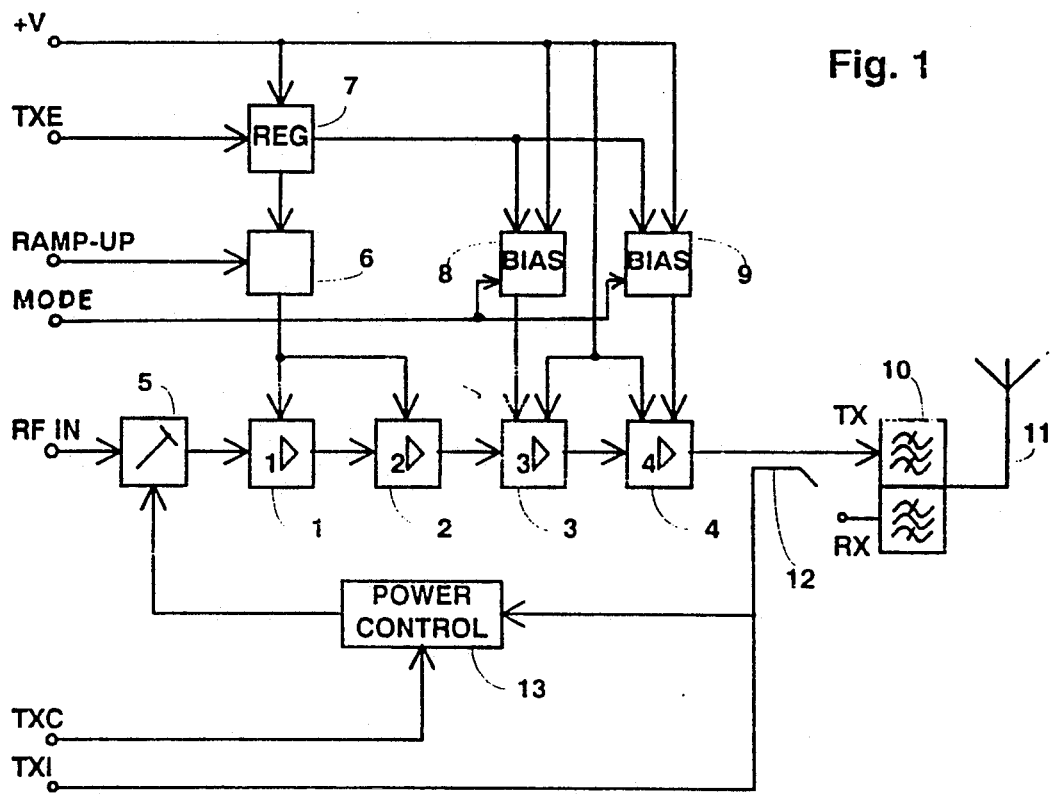

In the figure the transmitter in a dual-mode mobile radio telephone operating according to the North American dual-mode standard is connected to transmitter input TX of the duplex circuit 10, the output of which is connected to the antenna 11. The receiving parts (not shown) of the mobile phone are connected to the RX interface of the duplex circuit 10. The analog parts of the mobile phone operating according to the AMPS standard are not shown in the figure.

The radio frequency signal to be transmitted — which in this case is of the order 850 MHz — is connected to the transmitter section input RFIN at the voltage controlled amplifier/attenuator 5, the output of which is connected to a series of controllable linear power amplifiers 1, 2, 3 and 4. The output of the last amplifier 4 is connected to the TX terminal of the duplex circuit 10.

In this example the amplifier stages 1 and 2 are simultaneously controlled on/off by a ramp-up control circuit 6 controlled by the signal at the RAMP-UP input. The control circuit 6 consists of a series transistor, which connects on/off the regulated bias to the amplifiers 1 and 2. The power amplifier stages 3 and 4 are controlled on/off by respective bias control circuits 8 and 9. These bias control circuits 8 and 9 are controlled by the MODE input. The control circuits 6, 8 and 9 receive a regulated bias signal through the regulator circuit 7 controlled by the signal at the TXE input. The voltage regulator 7 and the bias control circuits 8 and 9, as well as the power amplifiers 3 and 4 are connected to the main battery voltage +V, e.g. +5 V.

The transmitter section output power level is controlled in a closed loop through the power control block 13, consisting essentially of a voltage controlled circuit including a comparator and an amplifier. The power output to the duplex circuit 10 is measured with a sensor device 12, essentially a directional coupler, which generates a signal output at terminal TXI to the controlling logic and connected to the power control block 13. The power control block 13 receives a controlling signal through the TXC input and compares this TXC signal with the measurement signal from circuit 12, whereby the difference is amplified and connected as a negative feedback signal to the voltage controlled amplifier/attenuator 5.

The terminals TXE, RAMP-UP, MODE, TXC and TXI are connected to the controlling logic (not shown in the figure) of the dual-mode mobile phone. The logic is realized with a microprocessor or a suitable controller known in the industry. The logic also includes suitable programs that control the operation of the mobile phone according to the appropriate standards and to the wishes of the user.

According to the requirements this transmitter arrangement has to operate in two modes, controlled by the MODE signal. In the analog mode (AMPS) there is required a continuous full or pre-defined power of the transmitter. In the digital mode the required power or efficiency may be lower, due to a pulsed operating principle. According to the appropriate standards the digital mode consists of a pulsed operation, i.e. the transmitter is sequentially connected on during a period 6,7 ms and off during a period 2×6,7 ms. Thus in the digital mode the transmitter is on or transmitting only one third of the time and off or not transmitting two thirds of the time. The transmitter must not connect any spurious signals or noise through amplifiers 1–4 to the antenna during the off period (according to the requirements the antenna signal must be less than −60 dBm during the off period).

The straightforward solution to the pulsed operation would be to switch the transmitter totally on and off, in response to a controlling signal, in this case e.g. the signals TXE (enable), TXC and MODE being connected on/off at the same moment controlled by the mobile phone logic or the microprocessor. This would, however, produce a very broad frequency spectrum at the antenna output at the beginning of each transmission period, before the transmitter is stabilized. This instable operation occurs due to the impedance level changes at each amplifier section, when the power is switched on. This instability period would also have a negative effect on the synthesizer circuit, degrading the frequency stability.

According to the invention the transmitter is connected on in a controlled sequence. This sequence can be started in advance to the transmitting period, so that the period timing of the pulsed operation is fulfilled.

According to the invention the signal switching order in the controlled sequence can be chosen in different ways, so that it suits the requirements and the operation of the mobile phone in question.

In the preferred embodiment the power on sequence is as follows (the digital mode is switched on, MODE input enabling the digital operation):

1. The voltages to the power amplifiers 3 and 4 are switched on, controlled by the signal at the TXE (transmit enable) terminal. At the same time collector voltages to the preamplifier stages 1 and 2 are switched on.

2. The base voltages to the preamplifier stages 1 and 2 are switched on with the signal at the RAMP-UP terminal.

3. The TXC (transmitter power control) signal is switched on, controlling the output level at the amplifier 4 output.

This sequential switching on ensures a stable operation. The impedance levels of the transmitter stages is stabilized before the power control TXC, or the proper on-signal, is switched on. This sequence function also stabilizes the synthesizer frequency control, due to the stable impedance levels.

Alternatively it is contemplated to switch on the amplifiers 1-4 in the sequence 1 - 2 - 3 - 4 - TXC. Still another possibility is to switch on the TXE and RAMP-UP simultaneously and the TXC signal a short moment later when the amplifier impedance levels are stabilized. Further it is conceivable to switch on the enable signal TXE in the first stage (enabling the amplifiers 3 and 4), then in the second stage the RAMP-UP and TXC signals simultaneously. And of course it is still possible to switch on all transmit enabling signals TXE, RAMP-UP, TXC at the same moment. In all alternatives above it is supposed that the digital mode is enabled by the signal at the MODE terminal.

It is understood that the power switch-off presents no major problems, as compared to those present at power switch-on. Therefore the power can be switched off at all amplifiers 1-4 essentially at the same moment.

The present invention provides the means to switch on the power of a dual-mode mobile radio telephone in a controlled manner, so as to minimize the transmission irregularities at the power switch-on. Therefore, while a particular embodiment of the invention has been described and shown, it should be understood that the invention is not limited thereto since many modifications may be made by those skilled in the art. It is therefore contemplated to cover by the present application any and all such modifications that fall within the true spirit and scope of the basic underlying principles disclosed and claimed herein.

We claim:

1. A method for providing a positive transmitter power switch-on of a transmitter in a dual-mode mobile radiotelephone having programmable logic in the digital mode for controlling switching-on of at least two transmitting power amplifier sections coupled in series to a duplex circuit, the method comprising the steps of:
    (a) sequentially switching on power amplifier sections so as to prevent a broad frequency spectrum of the transmitter from arising in an initial transmission phase of the transmitter due to impedance level changes at each transmitter power amplifier section; and thereafter
    (b) switching on a transmit power control signal, which enables a signal input to the transmitting power amplifier sections coupled in series to be amplified and output to the duplex circuit.

2. A method as in claim 1, wherein the step of sequentially switching on comprises:
    switching on the output power amplifier sections by enabling a transmit enable signal; and thereafter
    switching on input power amplifier sections by enabling a ramp-up signal.

3. A method as in claim 1, wherein the step of sequentially switching on comprises switching on the power amplifier sections (1-4) by enabling a transmit enable signal (TXE) and a ramp-up signal (RAMP-UP).

4. A method as in claim 1, wherein said power amplifier sections include preamplifier sections and power amplifier sections, and further comprising the steps of:
    switching on collector voltages to said preamplifier sections at the same time voltages to the power amplifier sections are sequentially switched on,
    switching on base voltages to the preamplifier sections with a signal at a RAMP-UP terminal, and
    switching on a transmitter power control which controls an output level at an output of said transmitting power amplifier sections.

5. A method for providing a positive transmitter power switch-on of a transmitter in a dual-mode mobile radiotelephone having programmable logic in the digital mode for controlling switching-on of at least an input power amplifier and output power amplifier sections coupled in series to a duplex circuit, the method comprising the steps of:
    a) switching on output power amplifier sections (3 and 4) by enabling a transmit enable signal (TXE); and thereafter
    b) switching on input power amplifier sections (1 and 2) by enabling a ramp-up signal (RAMP-UP) so as to prevent a broad frequency spectrum of the transmitter from arising in an initial transmission phase of the transmitter due to impedance level changes at each transmitter power amplifier section; and
    c) switching on a transmit power control signal (TXC), which enables a signal (RFIN) input to the transmitting power amplifier sections coupled in series (1-4) to be amplified and output to the duplex circuit (10).

6. A dual-mode mobile radiotelephone operated in accordance with the method of any of the claims 1-4.

* * * * *